United States Patent
Yano et al.

(10) Patent No.: US 12,334,993 B2
(45) Date of Patent: Jun. 17, 2025

(54) DELAY SIGNAL GENERATION CIRCUIT, TRANSMISSION CIRCUIT, ELECTRONIC CONTROL UNIT, AND VEHICLE

(71) Applicant: ROHM CO., LTD., Kyoto (JP)

(72) Inventors: Yuji Yano, Kyoto (JP); Toru Mukai, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 138 days.

(21) Appl. No.: 18/451,313

(22) Filed: Aug. 17, 2023

(65) Prior Publication Data

US 2023/0396288 A1 Dec. 7, 2023

Related U.S. Application Data

(63) Continuation of application No. PCT/JP2022/002574, filed on Jan. 25, 2022.

(30) Foreign Application Priority Data

Mar. 1, 2021 (JP) .................. 2021-031695

(51) Int. Cl.
*H04B 3/04* (2006.01)
*H03K 5/00* (2006.01)
(Continued)

(52) U.S. Cl.
CPC .................. *H04B 3/04* (2013.01); *H03K 5/01* (2013.01); *H04L 12/40032* (2013.01);
(Continued)

(58) Field of Classification Search
CPC .. H04B 3/04; H03K 5/01; H03K 2005/00013; H04L 12/40032;
(Continued)

(56) References Cited

U.S. PATENT DOCUMENTS

2006/0282714 A1* 12/2006 Kho .................. H03K 5/131
714/701
2010/0097113 A1* 4/2010 Matsui .................. H03K 7/08
327/176

(Continued)

FOREIGN PATENT DOCUMENTS

| JP | S61-195453 | 8/1986 |
| JP | H01-177221 | 7/1989 |

OTHER PUBLICATIONS

International Search Report and Written Opinion in International Appln. No. PCT/JP2022/002574, mailed on Apr. 19, 2022, 10 pages (with machine translation).

*Primary Examiner* — Sung S Ahn
(74) *Attorney, Agent, or Firm* — Fish & Richardson P.C.

(57) ABSTRACT

A delay signal generation circuit includes first to nth (n representing a natural number equal to or larger than 2) delay circuits and first to nth output terminals. The delay signal generation circuit is configured such that, in a first mode, an input signal passes through the first to kth (k representing a natural number equal to or larger than 1 but equal to or smaller than n) delay circuits in order and reaches the kth output terminal, and in a second mode, the input signal passes through the kth to nth delay circuits in reverse order and reaches the kth output terminal.

8 Claims, 9 Drawing Sheets

(51) Int. Cl.
*H03K 5/01* (2006.01)
*H04L 12/40* (2006.01)
(52) U.S. Cl.
CPC .............. *H03K 2005/00013* (2013.01); *H04L 2012/40215* (2013.01); *H04L 2012/40273* (2013.01)
(58) Field of Classification Search
CPC . H04L 2012/40215; H04L 2012/40273; H04L 25/02; H04L 25/03
See application file for complete search history.

(56) References Cited

U.S. PATENT DOCUMENTS

2010/0149137 A1\* 6/2010 Saito ..................... H03L 7/0995
345/204
2018/0026657 A1\* 1/2018 Lee .......................... H04L 7/04
341/100

\* cited by examiner

US 12,334,993 B2

DELAY SIGNAL GENERATION CIRCUIT, TRANSMISSION CIRCUIT, ELECTRONIC CONTROL UNIT, AND VEHICLE

CROSS-REFERENCE TO RELATED APPLICATIONS

This nonprovisional application is a continuation application of International Patent Application No. PCT/JP2022/002574 filed on Jan. 25, 2022, which claims priority Japanese Patent Application No. 2021-031695 filed in Japan on Mar. 1, 2021, the entire contents of which are hereby incorporated by reference.

BACKGROUND OF THE INVENTION

1. Technical Field

The invention disclosed herein relates to a delay signal generation circuit that generates a plurality of delay signals, and also relates to a transmission circuit, an electronic control unit, and a vehicle that incorporate such a delay signal generation circuit.

2. Description of Related Art

Vehicles such as automobiles incorporate a large number of electronic control units (ECUs). Communication among a large number of ECUs is achieved by, for example, CAN (controller area network) communication (see, e.g., Japanese unexamined patent application publication No. S61-195453).

In CAN communication, transmitted and received signals are each a differential signal. A differential signal is composed of a first signal and a second signal and can be decomposed into a common-mode component and a differential-mode component.

The common-mode component is the average of the first and second signals, and the differential-mode component is the difference between the first and second signals.

DETAILED DESCRIPTION

In the present description, a MOS transistor denotes a transistor of which the gate has a structure composed of at least three layers which are: a layer of a conductor or a semiconductor with a low resistance value such as polysilicon; a layer of an insulator; and a layer of a P-type, N-type, or intrinsic semiconductor. That is, a MOS transistor may have any gate structure other than a three-layer structure of metal, oxide, and semiconductor.

In the present description, a constant current denotes a current that is constant under ideal conditions and may be a current that can vary slightly with change in temperature and the like.

In the present description, a constant voltage denotes a voltage that is constant under ideal conditions and may be a voltage that can vary slightly with change in temperature and the like.

<Vehicle and CAN Communication System>

Figure 1:
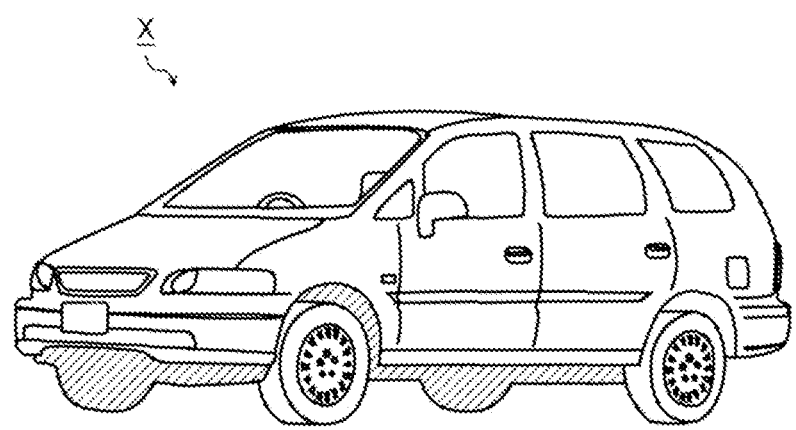
FIG. 1 is an exterior view of a vehicle according to one embodiment.

FIG. 1 is an exterior view of a vehicle X according to one embodiment. The vehicle X incorporates a plurality of ECUs (not shown in FIG. 1). The vehicle X also incorporates a battery (not shown).

Figure 2:
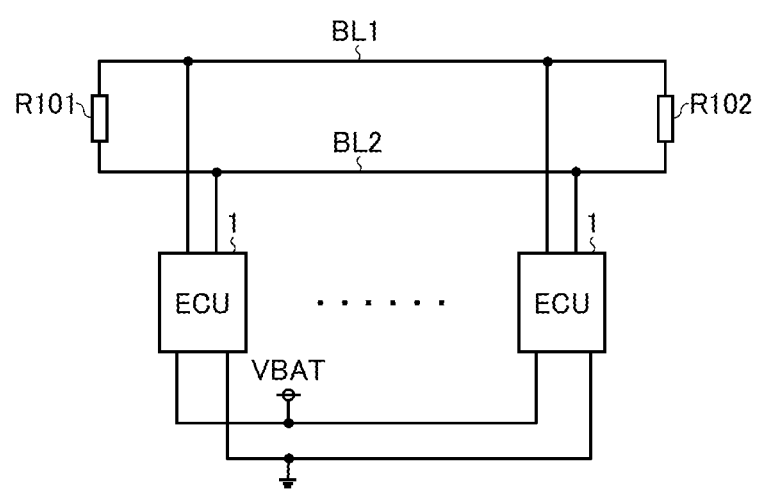
FIG. 2 is a schematic diagram of a CAN communication system.

FIG. 2 is a schematic diagram of a CAN communication system provided in the vehicle X. The CAN communication system shown in FIG. 2 includes a plurality of ECUs 1, a first bus line BL1, a second bus line BL2, and resistors R101 and R102.

To one terminal of the first bus line BL1, one terminal of the resistor R101 is connected; to the other terminal of the first bus line BL1, one terminal of the resistor R102 is connected. To one terminal of the second bus line BL2, the other terminal of the resistor R101 is connected; to the other terminal of the second bus line BL2, the other terminal of the resistor R102 is connected. The plurality of ECUs 1 are each connected to the first and second bus lines BL1 and BL2. The battery outputs a voltage VBAT, which is supplied to each of the plurality of ECUs 1. The plurality of ECUs 1 are each connected to a ground potential. The plurality of ECUs 1 use the voltage VBAT as their supply voltage.

<ECU>

Figure 3:
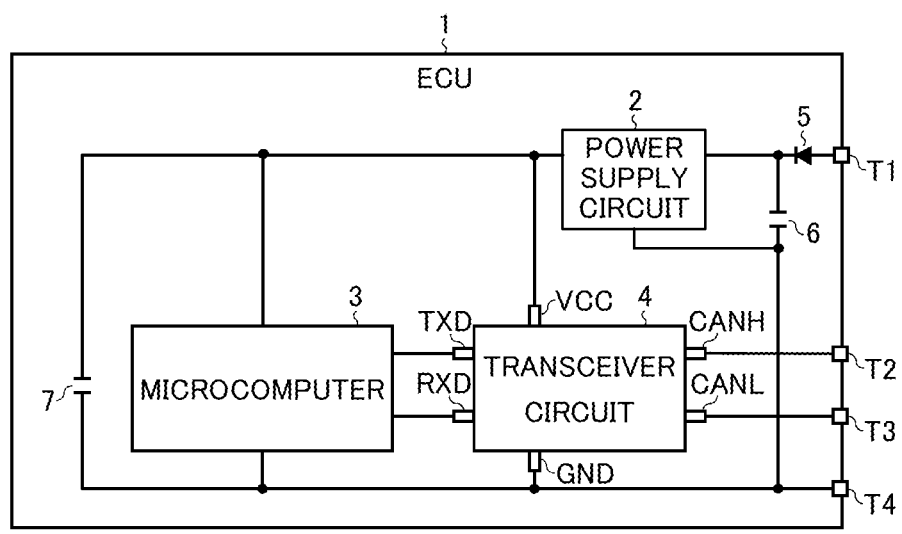
FIG. 3 is a diagram showing one configuration example of an ECU.

FIG. 3 is a diagram showing one configuration example of an ECU 1. The ECU 1 of the configuration example shown in FIG. 3 includes terminals T1 to T4, a power supply circuit 2, a microcomputer 3, a transceiver circuit 4, a diode 5, and capacitors 6 and 7.

The terminal T1 is fed with the voltage VBAT. The anode of the diode 5 is connected to the terminal T1. The cathode of the diode 5 is connected to the input terminal of the power supply circuit 2 and to the capacitor 6.

The output terminal of the power supply circuit 2 is connected to the supply voltage input terminal of the microcomputer 3, to a terminal VCC of the transceiver circuit 4, and to one terminal of the capacitor 7. The output terminal of the power supply circuit 2 outputs a constant voltage.

The microcomputer 3 transmits transmission data to a terminal TXD of the transceiver circuit 4, and receives reception data from a terminal RXD of the transceiver circuit 4. The transmission data and the reception data are each in the form of a single signal.

A terminal CANH of the transceiver circuit 4 is connected to the terminal T2, and a terminal CANL of the transceiver circuit 4 is connected to the terminal T3. The terminal T2 is connected to the first bus line BL1 shown in FIG. 2, and the terminal T3 is connected to the second bus line BL2 shown in FIG. 2.

The transceiver circuit 4 transmits the transmission data in a form converted into a differential signal (CAN signal) composed of a first signal SCANH (see FIG. 5, referred to later) and a second signal SCANL (see FIG. 5, referred to later). The transceiver circuit 4 outputs, in a form converted into the reception data, a differential signal (CAN signal) composed of a first signal and a second signal. Thus, the transceiver circuit 4 includes a transmission circuit that transmits a differential signal and a reception circuit that receives a differential signal. The first signal is transmitted across the first bus line BL1, and the second signal is transmitted across the second bus line BL2.

The ground terminal of the power supply circuit 2 is connected to the other terminal of the capacitor 6, to the terminal T4, to a terminal GND of the transceiver circuit 4, to the ground terminal of the microcomputer 3, and to the other terminal of the capacitor 7. The terminal T4 is connected to the ground potential.

<Transceiver Circuit>

Figure 4:
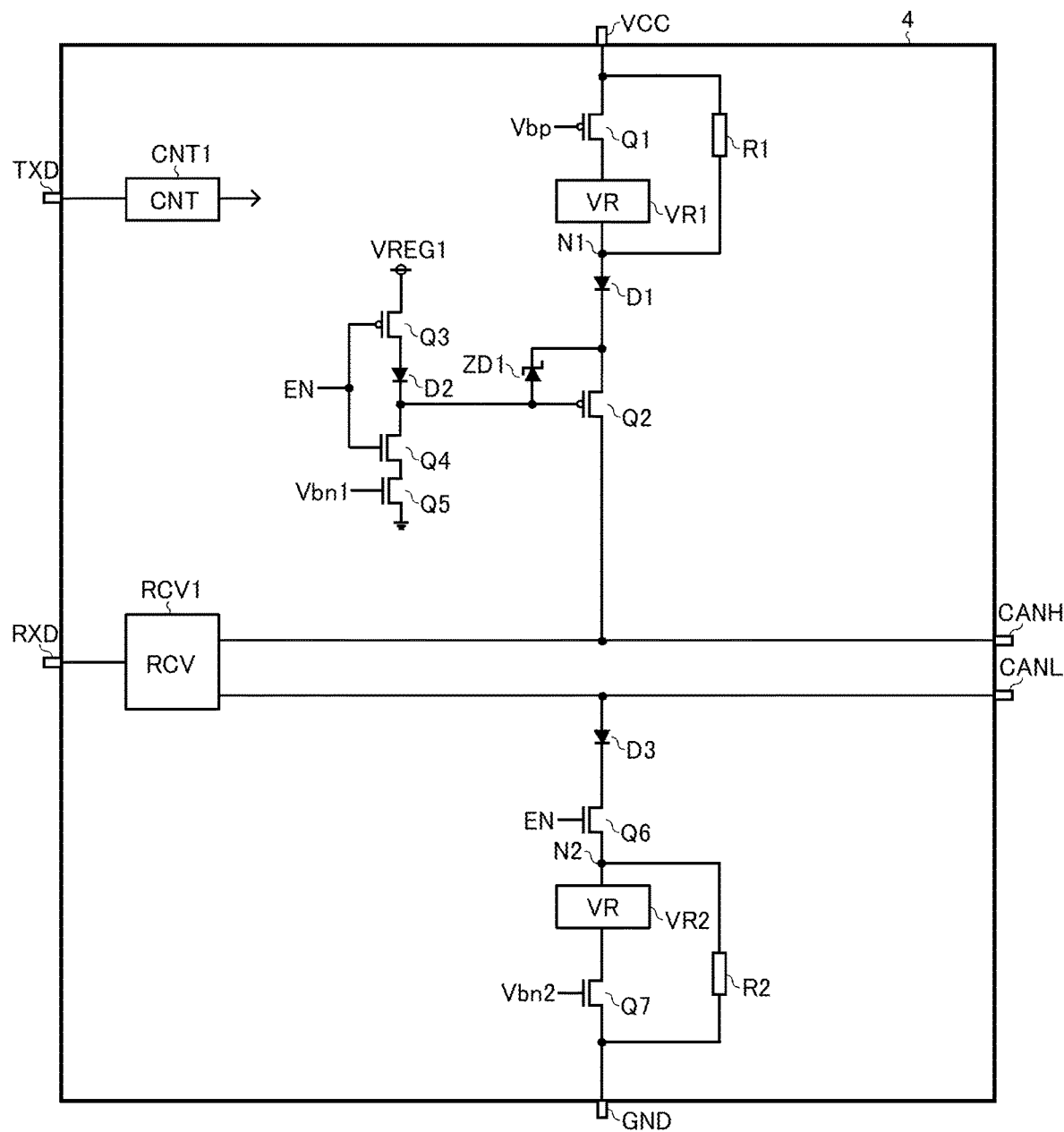
FIG. 4 is a diagram showing one configuration example of a transceiver circuit.

FIG. 4 is a diagram showing one configuration example of the transceiver circuit 4. The transceiver circuit 4 of the configuration example shown in FIG. 4 has terminals VCC, GND, TXD, RXD, CANH, and CANL.

The transceiver circuit 4 of the configuration example shown in FIG. 4 includes a first variable resistance circuit VR1, a second variable resistance circuit VR2, a P-channel MOS transistor (PMOS transistor) Q1 as a first current limiter, an N-channel MOS transistor (NMOS transistor) Q7 as a second current limiter, and a controller CNT1.

The transceiver circuit 4 of the configuration example shown in FIG. 4 also includes a pull-up resistor R1, a pull-down resistor R2, reverse-current prevention diodes D1 and D3, and a PMOS transistor Q2 and an NMOS transistor Q6 as clamping elements.

When the first variable resistance circuit VR1 is in a high-impedance state, the pull-up resistor R1 stabilizes the potential at a node N1 (the connection node between the first variable resistance circuit VR1 and the diode D1). When the second variable resistance circuit VR2 is in a high-impedance state, the pull-down resistor R2 stabilizes the potential at a node N2 (the connection node between the second variable resistance circuit VR2 and the NMOS transistor Q6).

The PMOS transistor Q2 and the NMOS transistor Q6 are double-diffused MOS transistors with high withstand voltages. The PMOS transistor Q2 clamps the source potential of the PMOS transistor Q2, and the NMOS transistor Q6 clamps the source potential of the NMOS transistor Q6.

The transceiver circuit 4 of the configuration example shown in FIG. 4 includes a receiver circuit RCV1, a diode D2, a PMOS transistor Q3, an NMOS transistor Q4, an NMOS transistor Q5, and a Zener diode ZD1.

The terminal VCC is connected to the source of the PMOS transistor Q1 and to one terminal of the pull-up resistor R1. The gate of the PMOS transistor Q1 is fed with a bias voltage Vbp, which is a constant voltage. Thus, the PMOS transistor Q1 serves as a constant-current source. If the terminal CANH is short-circuited to a voltage equal to or lower than the voltage applied to the terminal GND, the PMOS transistor Q1 limits the current from the terminal VCC to the terminal CANH. In this way, it is possible to suppress an overcurrent from the terminal VCC to the terminal CANH.

The drain of the PMOS transistor Q1 is connected to one terminal of the first variable resistance circuit VR1. The other terminal of the first variable resistance circuit VR1 is connected to the other terminal of the pull-up resistor R1 and to the anode of the diode D1.

The cathode of the diode D1 is connected to the source of the PMOS transistor Q2. The drain of the PMOS transistor Q2 is connected to the terminal CANH and to a first input terminal of the receiver circuit RCV1.

The PMOS transistor Q3, the NMOS transistor Q4, the NMOS transistor Q5, the diode D2, and the Zener diode ZD1 constitute a gate driving signal generation circuit, which generates a gate driving signal for the PMOS transistor Q2. The source of the PMOS transistor Q3 is fed with an internal voltage VREG1 generated within the transceiver circuit 4. The drain of the PMOS transistor Q3 is connected to the anode of the diode D2. The cathode of the diode D2 is connected to the anode of the Zener diode ZD1 and to the drain of the NMOS transistor Q4. The cathode of the Zener diode ZD1 is connected to the source of the PMOS transistor Q1. The gates of the PMOS transistor Q3 and the NMOS transistor Q4 are fed with an enable signal EN. When the enable signal EN is at high level, the transceiver circuit 4 is in an enabled state. When the enable signal EN is at low level, the transceiver circuit 4 is in a disabled state. The source of the NMOS transistor Q4 is connected to the drain of the NMOS transistor Q5. The source of the NMOS transistor Q5 is connected to the ground potential. The gate of the NMOS transistor Q5 is fed with a bias voltage Vbn1, which is a constant voltage.

The anode of the diode D3 is connected to the terminal CANL and to a second input terminal of the receiver circuit RCV1. The cathode of the diode D3 is connected to the drain of the NMOS transistor Q6. The source of the NMOS transistor Q6 is connected to one terminal of the second variable resistance circuit VR2 and to one terminal of the pull-down resistor R2. The gate of the NMOS transistor Q6 is fed with the enable signal EN.

The other terminal of the second variable resistance circuit VR2 is connected to the drain of the NMOS transistor Q7. The source of the NMOS transistor Q7 is connected to the other terminal of the pull-down resistor R2 and to the terminal GND. The gate of the NMOS transistor Q7 is fed with a bias voltage Vbp2, which is a constant voltage. Thus, the NMOS transistor Q7 serves as a constant-current source. If the terminal CANL is short-circuited to a voltage equal to or higher than the voltage supplied to the terminal VCC, the NMOS transistor Q7 limits the current from the terminal CANL to the terminal GND. In this way it is possible to suppress an overcurrent from the terminal CANL to the terminal GND.

The controller CNT1 receives the transmission data fed to the terminal TXD, and based on the transmission data, controls the resistance value of each of the first variable resistance circuit VR1 and the second variable resistance circuit VR2.

Figure 5:
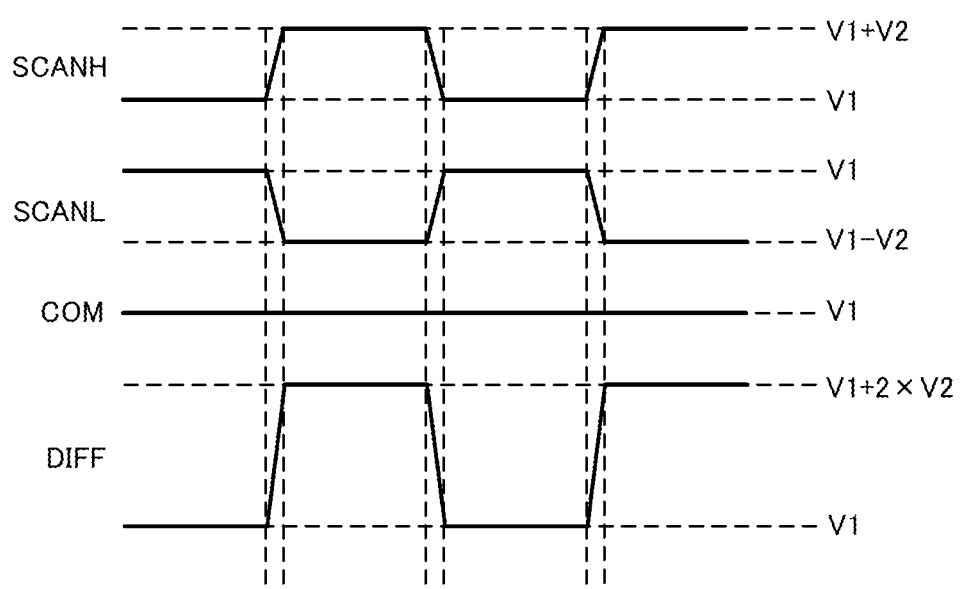
FIG. 5 is a timing chart showing a differential signal.

As shown in FIG. 5, the first signal SCANH mentioned above is a binary signal between V1 and (V1+V2) and the second signal SCANL mentioned above is a binary signal between V1 and (V1−V2). The differential signal (CAN signal) composed of the first and second signals SCANH and SCANL can be decomposed into a common-mode component COM, which is the average of the first and second signals SCANH and SCANL, and a differential-mode component DIFF, which is the difference between the first and second signals SCANH and SCANL.

A time lag (skew) between the first and second signals SCANH and SCANL produces noise in the common-mode component COM. This skew-induced common-mode noise can be suppressed by giving the first and second signals SCANH and SCANL waveforms containing small high-frequency components.

To achieve that, in the transceiver circuit 4 of the configuration example shown in FIG. 4, during a first transition period in which the voltage value of the first signal SCANH changes from V1 to (V1+V2) and during a second transition period in which the voltage value of the second signal SCANL changes from V1 to (V1−V2), the resistance value of the first variable resistance circuit VR1 is decreased gradually and, during a third transition period in which the voltage value of the first signal SCANH changes from (V1+V2) to V1 and during a fourth transition period in which the voltage value of the second signal SCANL changes from (V1−V2) to V1, the resistance value of the first variable resistance circuit VR1 is increased gradually, so that the first and second signals SCANH and SCANL have waveforms containing small high-frequency components. Except during the transition periods mentioned above, the controller CNT1 keeps the resistance value of the first variable resistance circuit VR1 at its maximum value.

Likewise, in the transceiver circuit 4 of the configuration example shown in FIG. 4, during the first transition period in which the voltage value of the first signal SCANH changes from V1 to (V1+V2) and during the second transition period in which the voltage value of the second signal SCANL changes from V1 to (V1−V2), the resistance value of the second variable resistance circuit VR2 is decreased gradually and, during the third transition period in which the voltage value of the first signal SCANH changes from (V1+V2) to V1 and during the fourth transition period in which the voltage value of the second signal SCANL changes from (V1−V2) to V1, the resistance value of the second variable resistance circuit VR2 is increased gradually, so that the first and second signals SCANH and SCANL have waveforms containing small high-frequency components. Except during the transition periods mentioned above, the controller CNT1 keeps the resistance value of the second variable resistance circuit VR2 at its maximum value.

Figure 6:
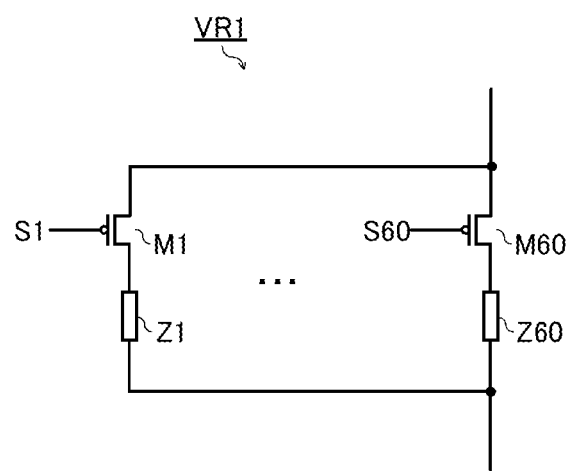
FIG. 6 is a diagram showing one configuration example of a first variable resistance circuit.
Figure 7:
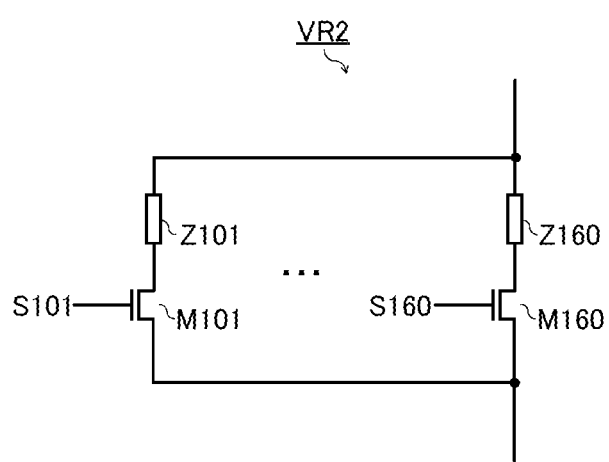
FIG. 7 is a diagram showing one configuration example of a second variable resistance circuit.

FIG. 6 is a diagram showing one configuration example of the first variable resistance circuit VR1, and FIG. 7 is a diagram showing one configuration example of the second variable resistance circuit VR2.

The first variable resistance circuit VR1 of the configuration example shown in FIG. 6, which includes PMOS transistors M1 to M60 as switches and resistors Z1 to Z60, is a parallel circuit of 60 series circuits of a resistor and a switch. The PMOS transistors M1 to M60 are turned on and off with control signals S1 to S60 output from the controller CNT1. There may be provided any number other than 60 of the series circuits mentioned above. In the configuration example shown in FIG. 6, the combined resistance of the resistors Z1 to Z60 determines the resistance value of the first variable resistance circuit VR1, and this permits accurate control of the resistance value of the first variable resistance circuit VR1.

The second variable resistance circuit VR2 of the configuration example shown in FIG. 7, which includes NMOS transistors M101 to M160 as switches and resistors Z101 to Z160, is a parallel circuit of 60 series circuits of a resistor and a switch. The NMOS transistors M101 to M160 are turned on and off with control signals S101 to S160 output from the controller CNT1. There may be provided any number other than 60 of the series circuits mentioned above. In the configuration example shown in FIG. 7, the combined resistance of the resistors Z101 to Z160 determines the resistance value of the second variable resistance circuit VR2, and this permits accurate control of the resistance value of the second variable resistance circuit VR2.

Figure 8:
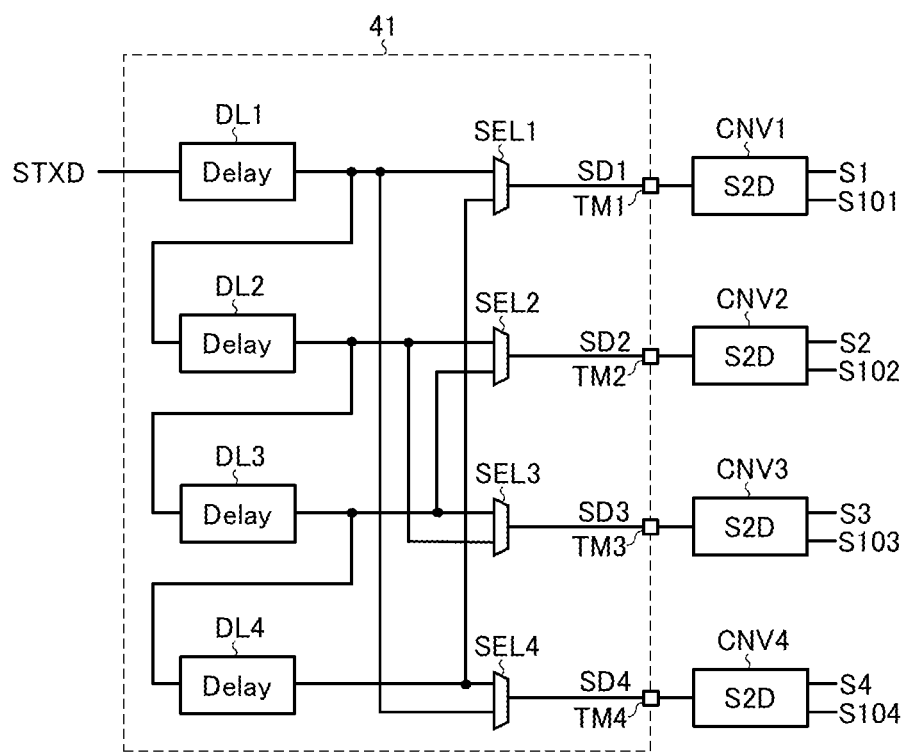
FIG. 8 is a diagram showing one configuration example of a controller.

FIG. 8 is a diagram showing one configuration example of the controller CNT1. Here, for ease of description, it is assumed that the first variable resistance circuit VR1 includes the PMOS transistors M1 to M4 out of the PMOS transistors M1 to M60, and that the second variable resistance circuit VR2 includes the NMOS transistors M101 to M104 out of the NMOS transistors M101 to M160.

The controller CNT1 of the configuration example shown in FIG. 8 includes a delay signal generation circuit 41 and conversion circuits CNV1 to CNV4. The delay signal generation circuit 41 includes delay circuits DL1 to DL4, selectors SEL1 to SEL4, and output terminals TM1 to TM4.

Transmission data STXD is fed to the input terminal of the first delay circuit DL1. The output terminal of the first delay circuit DL1 is connected to the input terminal of the second delay circuit DL2, to the first input terminal of the selector SEL1, and to the second input terminal of the selector SEL4. The output terminal of the second delay circuit DL2 is connected to the input terminal of the third delay circuit DL3, to the first input terminal of the selector SEL2, and to the second input terminal of the selector SEL3. The output terminal of the third delay circuit DL3 is connected to the input terminal of the fourth delay circuit DL4, to the first input terminal of the selector SEL4, and to the first input terminal of the selector SEL1. The output terminals of the selectors SEL1 to SEL4 are respectively connected to the output terminals TM1 to TM4.

The output terminals TM1 to TM4 respectively output delay signals SD1 to SD4 to the conversion circuits CNV1 to CNV4. The conversion circuit CNV1 converts the delay signal SD1 into control signals S1 and S101. The conversion circuit CNV2 converts the delay signal SD2 into control signals S2 and S102. The conversion circuit CNV3 converts the delay signal SD3 into control signals S3 and S103. The conversion circuit CNV4 converts the delay signal SD4 into control signals S4 and S104.

In a first mode, the selectors SEL1 to SEL4 each select and output a signal having been fed to the first input terminal thereof. Thus, in the first mode, the transmission data STXD as an input signal passes through the first to kth (k representing a natural number equal to or larger than 1 but equal to or smaller than 4) delay circuits in order and reaches the kth output terminal TMk.

In a second mode, the selectors SEL1 to SEL4 each select and output a signal having been fed to the second input terminal thereof. Thus, in the second mode, the transmission data STXD as an input signal passes through the first to kth (k representing a natural number equal to or larger than 1 but equal to or smaller then 4) delay circuits in order and reaches the (5−k)th output terminal TM(5−k).

With the delay circuits DL1 to DL4 having equal delay times, delay times between the delay signal SD1 and the delay signal SD2, between the delay signal SD2 and the delay signal SD3, and between the delay signal SD3 and the delay signal SD4 can be close to each other.

However, both in the first mode and in the second mode, the delays are transmitted in the same direction (in the direction from the first delay circuit DL1 toward the fourth delay circuit DL4), and this requires a long and complicated wiring. With such a long and complicated wiring, a deviation occurs among the delay time between the delay signal SD1 and the delay signal SD2, the delay time between the delay signal SD2 and the delay signal SD3, and the delay time between the delay signal SD3 and the delay signal SD4.

Figure 9:
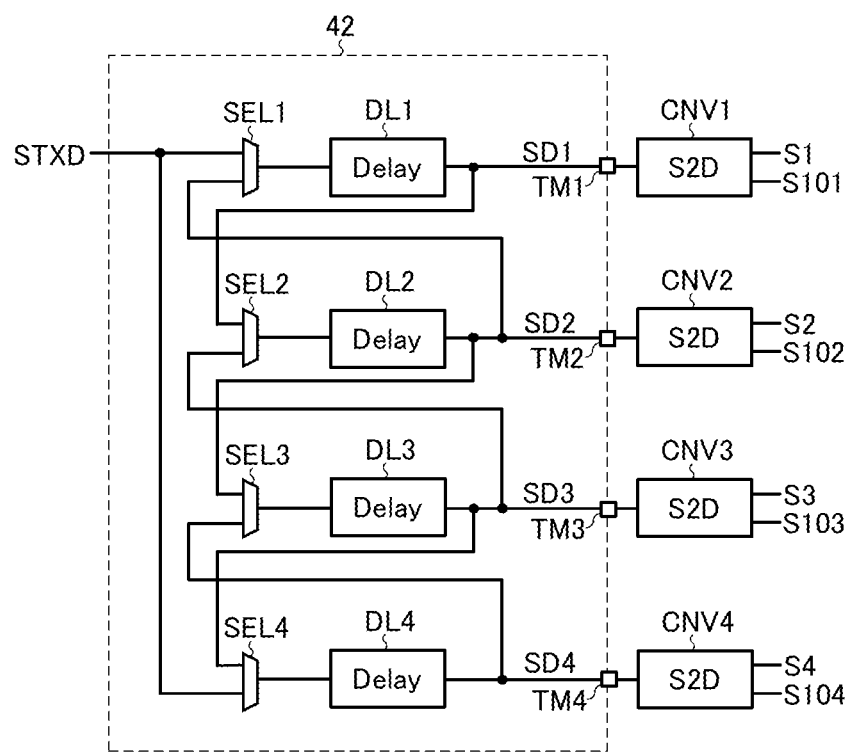
FIG. 9 is a diagram showing another configuration example of the controller.

FIG. 9 is a diagram showing another configuration example of the controller CNT1. Here, for ease of description, it is assumed that the first variable resistance circuit VR1 includes the PMOS transistors M1 to M4 out of the PMOS transistors M1 to M60, and that the second variable resistance circuit VR2 includes the NMOS transistors M101 to M104 out of the NMOS transistors M101 to M160.

The controller CNT1 of the configuration example shown in FIG. 9 includes a delay signal generation circuit 42 and the conversion circuits CNV1 to CNV4. The delay signal generation circuit 42 includes the delay circuits DL1 to DL4, the selectors SEL1 to SEL4, and the output terminals TM1 to TM4.

The transmission data STXD is fed to the first input terminal of the selector SEL1 and to the second input terminal of the selector SEL4. The second input terminal of the selector SEL1 is connected to the output terminal of the second delay circuit DL2, to the first input terminal of the selector SEL3, and to the second output terminal TM2.

The output terminal of the selector SEL1 is connected to the input terminal of the first delay circuit DL1. The output terminal of the first delay circuit DL1 is connected to the first output terminal TM1 and to the first input terminal of the selector SEL2.

The output terminal of the selector SEL2 is connected to the input terminal of the second delay circuit DL2. The second input terminal of the selector SEL2 is connected to the output terminal of the third delay circuit DL3, to the first input terminal of the selector SEL4, and to the third output terminal TM3.

The output terminal of the selector SEL3 is connected to the input terminal of the third delay circuit DL3. The second input terminal of the selector SEL3 is connected to the output terminal of the fourth delay circuit DL4 and to the fourth output terminal TM4.

The output terminal of the selector SEL4 is connected to the input terminal of the fourth delay circuit DL4.

The output terminals TM1 to TM4 respectively output delay signals SD1 to SD4 to the conversion circuits CNV1 to CNV4. The conversion circuit CNV1 converts the delay signal SD1 into the control signals S1 and S101. The conversion circuit CNV2 converts the delay signal SD2 into the control signals S2 and S102. The conversion circuit CNV3 converts the delay signal SD3 into the control signals S3 and S103. The conversion circuit CNV4 converts the delay signal SD4 into the control signals S4 and S104.

In the first mode, the selectors SEL1 to SEL4 each select and output a signal having been fed to the first input terminal thereof. Thus, in the first mode, the transmission data STXD as an input signal passes through the first to kth (k representing a natural number equal to or larger than 1 but equal to or smaller than 4) delay circuits in order and reaches the kth output terminal TMk.

In the second mode, the selectors SEL1 to SEL4 each select and output a signal having been fed to the second input terminal thereof. Thus, in the second mode, the transmission data STXD as an input signal passes through the first to kth delay circuits (k representing a natural number that is equal to or larger than 1 but equal to or smaller than 4) in reverse order and reaches the kth output terminal TMk.

With the delay circuits DL1 to DL4 having equal delay times, delay times between the delay signal SD1 and the delay signal SD2, between the delay signal SD2 and the delay signal SD3, and between the delay signal SD3 and the delay signal SD4 can be close to each other.

Delay is transmitted in the direction from the first delay circuit DL1 toward the fourth delay circuit DL4 in the first mode, and in the direction from the fourth delay circuit DL4 to the first delay circuit DL1 in the second mode; thus, there is no need of providing a long and complicated wiring. This helps suppress occurrence of a deviation among the delay time between the delay signal SD1 and the delay signal SD2, the delay time between the delay signal SD2 and the delay signal SD3, and the delay time between the delay signal SD3 and the delay signal SD4.

In the controller CNT1 of the configuration example shown in FIG. 9, the (m−1)th (m representing a natural number that is equal to or larger than 2 but equal to or smaller than n) delay circuit and the mth delay circuit are disposed adjacent to each other. That is, the controller CNT1 of the configuration example shown in FIG. 9 has a circuit arrangement in which no other delay circuit exists between the first delay circuit DL1 and the second delay circuit DL2, no other delay circuit exists between the second delay circuit DL2 and the third delay circuit DL3, and no other delay circuit exists between the third delay circuit DL3 and the fourth delay circuit DL4. This circuit arrangement allows reduced wiring length, and thus helps further suppress occurrence of a deviation among the delay time between the delay signal SD1 and the delay signal SD2, the delay time between the delay signal SD2 and the delay signal SD3, and the delay time between the delay signal SD3 and the delay signal SD4.

<Notes>

The present invention can be implemented with any configuration other than that of the embodiment described above, with any modifications made without departure from the spirit of the present invention. It should be understood that the foregoing embodiment is not limitative but illustrative in every respect. The technical scope of the present invention is not determined by the foregoing embodiment but by the claims, and should be construed to include all modifications equivalent in meaning and scope to the claims.

For example, while in the embodiment described above, a transceiver circuit performs CAN communication, the transceiver circuit may instead perform any communication other than CAN communication.

According to one aspect of what is disclosed herein, a delay signal generation circuit (41, 42) includes first to nth (n representing a natural number equal to or larger than 2) delay circuits (DL1 to DL4) and first to nth output terminals (TM1 to TM4). The delay signal generation circuit is configured such that, in a first mode, an input signal passes through the first to kth (k representing a natural number equal to or larger than 1 but equal to or smaller than n) delay circuits in order and reaches the kth output terminal, and, the delay signal generation circuit is configured such that, in a second mode, the input signal passes through the kth to nth delay circuits in reverse order and reaches the kth output terminal. (A first configuration.)

The delay signal generation circuit of the first configuration described above is capable of generating a plurality of delay signals among which delay time deviation is small.

In the delay signal generation circuit of the first configuration described above, the (m−1)th (m representing a natural number equal to or larger than 2 but equal to or smaller than n) delay circuit and the mth delay circuit may be disposed adjacent to each other. (A second configuration.)

In the delay signal generation circuit of the second configuration described above, the wiring can be reduced in length, and this helps further suppress occurrence of deviation among the delay times.

According to another aspect of what is disclosed herein, a transmission circuit includes a first terminal (VCC) configured to have a first voltage applied thereto, a second terminal (CANH), a third terminal (CANL), a fourth terminal (GND) configured to have a second voltage applied thereto, the second voltage being lower than the first voltage, a first variable resistance circuit (VR1) disposed between the first terminal and the second terminal, the first variable resistance circuit being configured to be able to vary a resistance value thereof a second variable resistance circuit (VR2) disposed between the third and fourth terminals, the second variable resistance circuit being configured to be able to vary a resistance value thereof, and a controller (CNT1) configured to control the resistance value of each of the first variable resistance circuit and the second variable resistance circuit based on transmission data. The first variable resistance circuit and second variable resistance circuit each include a parallel circuit of a plurality of series circuits of a resistor (Z1 to Z60, Z101 to Z160) and a switch (M1 to M60, M101 to M160). The controller is configured to include the delay signal generation circuit of the first or second configuration described above. (A third configuration).

With the transmission circuit of the third configuration described above, it is possible to suppress deviation among the delay times of the plurality of delay signals generated by the delay signal generation circuit.

According to yet another aspect of what is disclosed herein, an electronic control unit (1) includes the transmission circuit of the third configuration described above and a computer (3) configured to transmit the transmission data to the transmission circuit. (A fourth configuration.)

With the electronic control unit of the fourth configuration described above, it is possible to reduce deviation among delay times of the plurality of delay signals generated by the delay signal generation circuit.

According to still another aspect of what is disclosed herein, a vehicle (X) includes a communication bus (BL1, BL2) and a plurality of the electronic control units of the fourth configuration described above, the plurality of the electronic control units being connected to the communication bus. (A fifth configuration.)

In the vehicle of the fifth configuration described above, it is possible to suppress deviation among delay times of the plurality of delay signals generated by the delay signal generation circuit.

The invention claimed is:

1. A delay signal generation circuit, comprising:
   first to nth delay circuits (n representing a natural number equal to or larger than 2); and
   first to nth output terminals,
   wherein,
   the delay signal generation circuit is configured such that, in a first mode, an input signal passes through the first to kth (k representing a natural number equal to or larger than 1 but equal to or smaller than n) delay circuits in order and reaches the kth output terminal, and,
   the delay signal generation circuit is configured such that, in a second mode, the input signal passes through the kth to nth delay circuits in reverse order and reaches the kth output terminal.

2. The delay signal generation circuit according to claim 1,
   wherein
   the (m−1)th delay circuit (m representing a natural number equal to or larger than 2 but equal to or smaller than n) and the mth delay circuit are disposed adjacent to each other.

3. A transmission circuit, comprising:
   a first terminal configured to have a first voltage applied thereto;
   a second terminal;
   a third terminal;
   a fourth terminal configured to have a second voltage applied thereto, the second voltage being lower than the first voltage;
   a first variable resistance circuit disposed between the first terminal and the second terminal, the first variable resistance circuit being configured to be able to vary a resistance thereof;
   a second variable resistance circuit disposed between the third terminal and the fourth terminal, the second variable resistance circuit being configured to be able to vary a resistance thereof; and
   a controller configured to control the resistance value of each of the first variable resistance circuit and the second variable resistance circuit based on transmission data,
   wherein
   the first variable resistance circuit and the second variable resistance circuit each include a parallel circuit of a plurality of series circuits of a resistor and a switch, and the controller includes the delay signal generation circuit according to claim 1.

4. A transmission circuit, comprising:
   a first terminal configured to have a first voltage applied thereto;
   a second terminal;
   a third terminal;
   a fourth terminal configured to have a second voltage applied thereto, the second voltage being lower than the first voltage;
   a first variable resistance circuit disposed between the first terminal and the second terminal, the first variable resistance circuit being configured to be able to vary a resistance thereof;
   a second variable resistance circuit disposed between the third terminal and the fourth terminal, the second variable resistance circuit being configured to be able to vary a resistance thereof; and
   a controller configured to control the resistance value of each of the first variable resistance circuit and the second variable resistance circuit based on transmission data,
   wherein
   the first variable resistance circuit and the second variable resistance circuit each include a parallel circuit of a plurality of series circuits of a resistor and a switch, and the controller includes the delay signal generation circuit according to claim 2.

5. An electronic control unit, comprising:
   the transmission circuit according to claim 3; and
   a computer configured to transmit the transmission data to the transmission circuit.

6. An electronic control unit, comprising:
   the transmission circuit according to claim 4; and
   a computer configured to transmit the transmission data to the transmission circuit.

7. A vehicle, comprising:
   a communication bus; and
   a plurality of the electronic control units according to claim 5, the plurality of the electronic control units being connected to the communication bus.

8. A vehicle, comprising:
   a communication bus; and
   a plurality of the electronic control units according to claim 6, the plurality of the electronic control units being connected to the communication bus.

* * * * *